United States Patent
Takaiwa et al.

(10) Patent No.: US 8,848,126 B2
(45) Date of Patent: Sep. 30, 2014

(54) OPTICAL SENSOR COMPRISING A PHOTODIODE HAVING A P-TYPE SEMICONDUCTOR REGION, AN INTRINSIC SEMICONDUCTOR REGION, AND AN N-TYPE SEMICONDUCTOR REGION

(75) Inventors: Norihisa Takaiwa, Osaka (JP); Masahiro Fujiwara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 91 days.

(21) Appl. No.: 13/821,574

(22) PCT Filed: Sep. 29, 2011

(86) PCT No.: PCT/JP2011/072390
§ 371 (c)(1),
(2), (4) Date: Mar. 8, 2013

(87) PCT Pub. No.: WO2012/046628
PCT Pub. Date: Apr. 12, 2012

(65) Prior Publication Data
US 2013/0169914 A1    Jul. 4, 2013

(30) Foreign Application Priority Data
Oct. 6, 2010 (JP) ................. 2010-226357

(51) Int. Cl.
| G02F 1/136 | (2006.01) |
| G02F 1/133 | (2006.01) |
| H01L 27/15 | (2006.01) |
| H01L 27/148 | (2006.01) |
| H01L 31/105 | (2006.01) |
| H01L 27/146 | (2006.01) |
| H01L 31/0224 | (2006.01) |
| G02F 1/1333 | (2006.01) |
| H01L 31/113 | (2006.01) |
| G02F 1/135 | (2006.01) |

(52) U.S. Cl.
CPC ...... *H01L 27/14643* (2013.01); *H01L 31/1055* (2013.01); *H01L 31/022408* (2013.01); *G02F 1/13338* (2013.01); *G02F 1/1354* (2013.01); *H01L 31/1133* (2013.01); *H01L 31/105* (2013.01)
USPC ................. 349/50; 349/116; 257/80; 257/233

(58) Field of Classification Search
USPC ........ 349/50–52, 116, 140, 199; 257/80, 233, 257/244
See application file for complete search history.

(56) References Cited

U.S. PATENT DOCUMENTS

2010/0118237 A1* 5/2010 Katoh et al. ............... 349/110
2010/0140631 A1 6/2010 Yamanaka et al.

FOREIGN PATENT DOCUMENTS

WO 2008/133162 A1 11/2008

OTHER PUBLICATIONS

Official Communication issued in International Patent Application No. PCT/JP2011/072390, mailed on Dec. 6, 2011.

*Primary Examiner* — Paul Lee
(74) *Attorney, Agent, or Firm* — Keating & Bennett, LLP (57) ABSTRACT

Provided is an optical sensor having such a novel structure that even if an intrinsic semiconductor region has a short substantial length in a direction parallel with a forward direction of a photodiode, a light receiving area can be ensured, whereby light detection sensitivity can be improved; and a liquid crystal panel including the optical sensor. The optical sensor includes: a photodiode (26) provided with a semiconductor film (28) having a p-type semiconductor region (28*p*), an intrinsic semiconductor region (28*i*), and an n-type semiconductor region (28*n*); a first gate line (38*a*) formed above the intrinsic semiconductor region (28*i*), a negative voltage being applied to the first gate line; and a second gate line (38*b*) formed above the intrinsic semiconductor region (28*i*), a positive voltage being applied to the second gate line, wherein a predetermined clearance is formed between the first gate line (38*a*) and the second gate line (38*b*), above the intrinsic semiconductor region (28*i*).

7 Claims, 6 Drawing Sheets

OPTICAL SENSOR COMPRISING A PHOTODIODE HAVING A P-TYPE SEMICONDUCTOR REGION, AN INTRINSIC SEMICONDUCTOR REGION, AND AN N-TYPE SEMICONDUCTOR REGION

TECHNICAL FIELD

The present invention relates to an optical sensor, and a liquid crystal panel provided with the optical sensor.

BACKGROUND ART

Conventionally, a liquid crystal display device provided with optical sensors has been known, as a device that realizes a touch sensor function and the like. In such a liquid crystal display device, from the viewpoint of the reduction of the number of components, and the like, optical sensors are formed monolithically in an active matrix substrate incorporated in a liquid crystal panel. A well-known example of such an optical sensor is a photodiode having a lateral structure.

In the photodiode having the lateral structure, if the intrinsic semiconductor region has a too large length in the direction parallel with the forward direction of the photodiode, a region in which photoexcitation occurs in response to received light does not extent over an entirety of the intrinsic semiconductor region. Consequently, the other region than the region where the photoexcitation occurs in response to received light functions as a resistive region, thereby causing a decrease in the output. On the other hand, if the intrinsic region has a too short length in the direction parallel with the forward direction of the photodiode, the region in which photoexcitation occurs in response to received light has a smaller area, thereby causing a decrease in the light conversion efficiency. Therefore, it is significantly important to make the intrinsic semiconductor region have a desirable length in the direction parallel with the forward direction of the photodiode, in the photodiode having the lateral structure. Further, it is significantly important also to suppress variations in the lengths of the intrinsic semiconductor regions in the direction parallel with the forward direction of the photodiode, in the photodiodes having the lateral structure.

Then, as described in WO 2008/133162 (Patent Document 1), it has been proposed to define the boundary between the p-type semiconductor region and the intrinsic semiconductor region, and the boundary between the n-type semiconductor region and the intrinsic semiconductor region with two metal lines provided above the silicon film.

It should be noted that in the photodiode described in Patent Document 1, appropriate voltages are applied to the two metal lines positioned above the intrinsic semiconductor regions, respectively, so that a region where photoexcitation occurs in response to received light should be concentrated to the center of the intrinsic semiconductor region. This causes the substantial length of the intrinsic semiconductor region in the direction parallel with the forward direction of the photodiode to be approximately the same as the distance between the two metal lines. Therefore, in order to set the substantial length of the intrinsic semiconductor region in the direction parallel with the forward direction of the photodiode to a desired length, it is necessary to consider the distance between the two metal lines.

However, in the case of the photodiode described in Patent Document 1, if the distance between the two metal lines is shortened simply, this causes the light receiving area to decrease, which leads to a problem of difficulty in obtaining sufficient detection sensitivity.

DISCLOSURE OF INVENTION

It is an object of the present invention to provide an optical sensor having a novel structure with which, even if the substantial length of the intrinsic semiconductor region in the direction parallel with the forward direction of a photodiode is short, a sufficient light receiving area can be obtained, whereby the light detection sensitivity can be improved; and to provide a liquid crystal panel provided with the optical sensors.

An optical sensor of the present invention includes: a photodiode provided with a semiconductor film having a p-type semiconductor region, an intrinsic semiconductor region, and an n-type semiconductor region; a first gate line formed above the intrinsic semiconductor region, a negative voltage being applied to the first gate line; and a second gate line formed above the intrinsic semiconductor region, a positive voltage being applied to the second gate line, wherein the first gate line includes: a first boundary definition line that extends along a boundary between the intrinsic semiconductor region and the p-type semiconductor region and crosses the intrinsic semiconductor region; and a first extension line that extends from the first boundary definition line toward the second gate line, the second gate line includes: a second boundary definition line that extends along a boundary between the intrinsic semiconductor region and the n-type semiconductor region and crosses the intrinsic semiconductor region; and a second extension line that extends from the second boundary definition line toward the first gate line, and a predetermined clearance is formed between the first gate line and the second gate line, above the intrinsic semiconductor region.

With the optical sensor of the present invention, even if the intrinsic semiconductor region has a short substantial length in the direction parallel with the forward direction of the photodiode, a light receiving area can be ensured, whereby light detection sensitivity can be improved.

DESCRIPTION OF THE INVENTION

An optical sensor according to one embodiment of the present invention includes: a photodiode provided with a semiconductor film having a p-type semiconductor region, an intrinsic semiconductor region, and an n-type semiconductor region; a first gate line formed above the intrinsic semiconductor region, a negative voltage being applied to the first gate line; and a second gate line formed above the intrinsic semiconductor region, a positive voltage being applied to the second gate line, wherein the first gate line includes: a first boundary definition line that extends along a boundary between the intrinsic semiconductor region and the p-type semiconductor region and crosses the intrinsic semiconductor region; and a first extension line that extends from the first boundary definition line toward the second gate line, the second gate line includes: a second boundary definition line that extends along a boundary between the intrinsic semiconductor region and the n-type semiconductor region and crosses the intrinsic semiconductor region; and a second extension line that extends from the second boundary definition line toward the first gate line, and a predetermined clearance is formed between the first gate line and the second gate line, above the intrinsic semiconductor region (the first configuration relating to an optical sensor).

In the first configuration relating to an optical sensor, the application of a negative voltage to the first gate line causes holes to increase in a region positioned directly below the first gate line in the intrinsic semiconductor region. This causes the p-type semiconductor region to substantially spread to the region positioned directly below the first gate line in the intrinsic semiconductor region.

On the other hand, the application of a positive voltage to the second gate line causes free electrons to increase in a region positioned directly below the second gate line in the intrinsic semiconductor region. This causes the n-type semiconductor region to substantially spread to the region positioned directly below the second gate line in the intrinsic semiconductor region.

In this way, the substantial spreading of the p-type semiconductor region and the n-type semiconductor region allows the region where the process of photoexcitation occurs in response to received light in the photodiode to be formed so as to extend, not only in the direction perpendicular to the forward direction of the photodiode, but also in the direction parallel with the forward direction of the photodiode. In other words, the substantial length of the intrinsic semiconductor region in the direction perpendicular to the forward direction of the photodiode increases. This makes it possible to ensure a light receiving area, even if the intrinsic semiconductor region has a short substantial length in the direction parallel with the forward direction of the photodiode. As a result, the light detection sensitivity can be enhanced.

The second configuration relating to the optical sensor is the above-described first configuration relating to the optical sensor that is modified so that at least either the first extension line or the second extension line is plural in the number, and the first extension lines and the second extension lines are arranged alternately in a direction perpendicular to a forward direction of the photodiode. In such a configuration, the region where photoexcitation occurs in response to received light can be made to snake. This makes it easier to increase the substantial length of the intrinsic semiconductor region in the direction perpendicular to the forward direction of the photodiode. As a result, even if the intrinsic semiconductor region has a short substantial length in the direction parallel with the forward direction of the photodiode, a light receiving area can be ensured more easily.

The third configuration relating to the optical sensor is the above-described second configuration relating to the optical sensor that is modified so that the first extension line has a width smaller than a width of the predetermined clearance formed between the first extension line and the second extension line. In such a configuration, the number of times of bending of the region where photoexcitation occurs in response to received light, which extends in such a manner as to snake, can be increased. This makes it further easier to increase the substantial length of the intrinsic semiconductor region in the direction perpendicular to the forward direction of the photodiode. As a result, even if the intrinsic semiconductor region has a short substantial length in the direction parallel with the forward direction of the photodiode, a light receiving area can be ensured more easily.

The fourth configuration relating to the optical sensor is the above-described second or third configuration relating to the optical sensor that is modified so that the second extension line has a width smaller than a width of the predetermined clearance formed between the first extension line and the second extension line. In such a configuration, the number of times of bending of the region where photoexcitation occurs in response to received light, which extends in such a manner as to snake, can be increased. This makes it further easier to increase the substantial length of the intrinsic semiconductor region in the direction perpendicular to the forward direction of the photodiode. As a result, even if the intrinsic semiconductor region has a short substantial length in the direction parallel with the forward direction of the photodiode, a light receiving area can be ensured more easily.

Particularly, in the case of combination with the third configuration, the number of times of bending of the region where photoexcitation occurs in response to received light, which extends in such a manner as to snake, can be increased further. As a result, this makes it extremely easier to increase the substantial length of the intrinsic semiconductor region in the direction perpendicular to the forward direction of the photodiode.

The fifth configuration relating to the optical sensor is any one of the above-described first to fourth configurations relating to the optical sensor that is modified so that the predetermined clearance formed between the first gate line and the second gate line above the intrinsic semiconductor region has a width of 3 to 5 µm. In this configuration, a decrease in the light conversion efficiency can be avoided, while deterioration of the output characteristics can be avoided.

The sixth configuration relating to the optical sensor is any one of the above-described first to fifth configurations relating to the optical sensor that is modified so that at least one of the first extension line and the second extension line is formed along an edge of the intrinsic semiconductor region extending in a direction parallel with a forward direction of the photodiode. In such a configuration, the region where photoexcitation occurs in response to received light can be formed efficiently in the intrinsic semiconductor region. As a result, a light receiving area can be ensured more easily.

A liquid crystal panel according to one embodiment of the present invention includes: the optical sensor according to one embodiment of the present invention; a substrate on which the optical sensor is formed; a counter substrate arranged vis-à-vis a surface of the substrate on which the optical sensor is formed; and a liquid crystal layer sealed between the substrate and the counter substrate.

Hereinafter, more specific embodiments of the present invention are explained with reference to the drawings. It should be noted that the drawings referred to hereinafter show, in a simplified manner, only principal members illustration of which is needed for explanation of the present invention, among constituent members of an embodiment of the present invention, for convenience of explanation. Therefore, an optical sensor and a liquid crystal panel according to the present invention may include arbitrary members that are not shown in the drawings that the present specification refers to. Further, the dimensions of the members shown in the drawings do not faithfully reflect actual dimensions of constituent members, actual dimensional ratios of the constituent members, etc.

[Embodiment 1]

Figure 1:
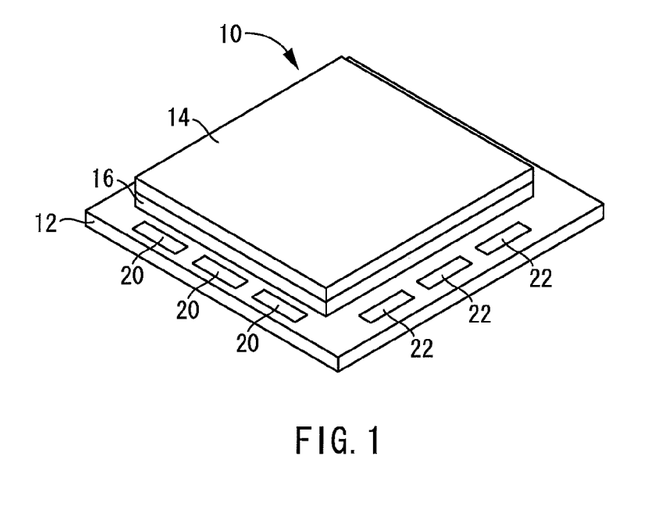
FIG. 1 is a perspective view showing a liquid crystal panel as one embodiment of the present invention relating to a liquid crystal panel.

FIG. 1 shows a liquid crystal panel 10 as one embodiment of the present invention relating to a liquid crystal panel. This liquid crystal panel 10 includes an active matrix substrate 12, a counter substrate 14, and a liquid crystal layer 16 sealed between these substrates 12 and 14.

Figure 2:
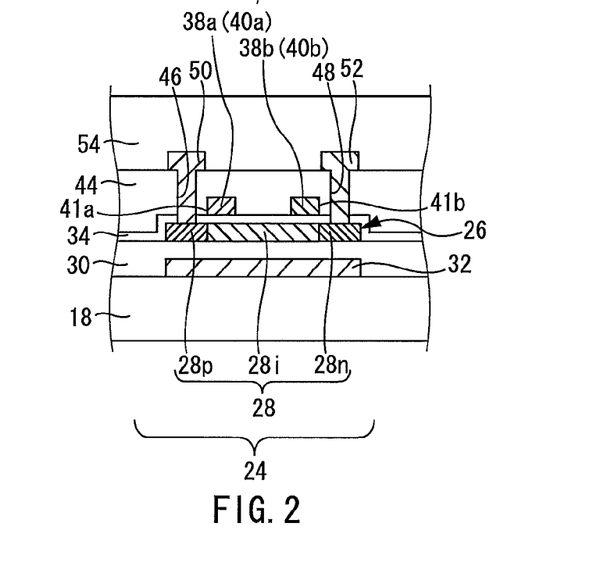
FIG. 2 is a cross-sectional view showing an optical sensor provided in the liquid crystal panel shown in FIG. 1, taken along a II-II direction in FIG. 3.

The active matrix substrate 12 includes a glass substrate 18 as a substrate (see FIG. 2). On the glass substrate 18, a plurality of pixels (not shown) are formed in matrix. Each pixel thus formed includes a thin film transistor as an active element, and a pixel electrode. On the glass substrate 18, a region where the plurality of pixels are formed in matrix is a display region, which is not shown.

At a position opposed to this display region, a counter substrate 14 is provided. It should be noted that a counter electrode and color filters are provided on the counter substrate 14, though not shown.

Further, on the glass substrate 18 provided in the active matrix substrate 12, gate drivers 20 and data drivers 22 are provided in a peripheral area around the display region. The gate drivers 20 are connected to thin film transistors provided in the pixels by gate lines (not shown) extending in the horizontal direction of the display region. The data drivers 22 are connected to the thin film transistors provided in the pixels by data lines (not shown) extending in the vertical direction of the display region.

In the display area formed on the glass substrate 18 provided in the active matrix substrate 12, optical sensors 24 (see FIG. 2) as Embodiment 1 of the present invention relating to an optical sensor are provided. It should be noted that the optical sensors 24 are arranged in the vicinities of the pixels, though not shown in the drawings. The optical sensor 24 is provided with respect to each pixel. The optical sensor 24 includes a photodiode 26, as shown in FIG. 2.

The photodiode 26 includes a semiconductor film 28 provided on the glass substrate 18. It should be noted that the semiconductor film 28 is formed through the same process as that for a semiconductor film provided in the thin film transistor.

In the present embodiment, the semiconductor film 28 is formed on the glass substrate 18 with a base layer 30 formed on the glass substrate 18 being interposed therebetween. The base layer 30 is provided in order to prevent impurities from the glass substrate 18 from diffusing. As the base layer 30, a silicon oxide film or the like can be used, for example. The base layer 30 preferably has a thickness of 100 to 600 nm, and more preferably 150 to 450 nm.

Examples that can be used as the semiconductor film 28 include an amorphous silicon film, and a crystalline silicon film. As the crystalline silicon film, for example, a low-temperature polysilicon film, a high-temperature polysilicon film, a continuous grain silicon film, a microcrystalline silicon film, or the like can be used. The semiconductor film 28 has a thickness of 25 to 100 nm.

In the semiconductor film 28, a p-type semiconductor region 28p, an intrinsic semiconductor region 28i, and an n-type semiconductor region 28n are formed so as to be juxtaposed in this order along the base layer 30. As is clear from this, the photodiode 26 is a PIN diode having a so-called lateral structure.

Below this photodiode 26 (semiconductor film 28), a light shielding film 32 is provided, which is formed on the glass substrate 18 and is covered with the base layer 30. This prevents light having passed through the glass substrate 18 from being incident on the semiconductor film 28.

As the light shielding film 32, a metal film can be used, for example. Considering the method of manufacturing the active matrix substrate 12, it is desirable to use, as the light shielding film 32, a metal film formed with any one of tantalum, tungsten, molybdenum, and the like that are high-melting-point metals. The light shielding film 32 has a thickness of 200 to 300 nm.

A gate insulating film 34 is formed on the base layer 30 so as to cover the photodiode 26 (the semiconductor film 28). As the gate insulating film 34, for example, a silicon oxide film or the like can be used. It should be noted that the gate insulating film 34 also covers the semiconductor film provided in the thin film transistor (not shown).

On the gate insulating film 34, two gate lines 38a and 38b are provided at positions that, when projected in the thickness direction of the glass substrate 18, overlap the intrinsic semiconductor region 28i. As the two gate lines 38a and 38b, metal lines that contain, as a principal component, at least one of tantalum, tungsten, molybdenum, titanium, and aluminum, can be used, for example. In the present embodiment, the gate line 38a corresponds to a first gate line, and the gate line 38b corresponds to a second gate line.

Figure 3:
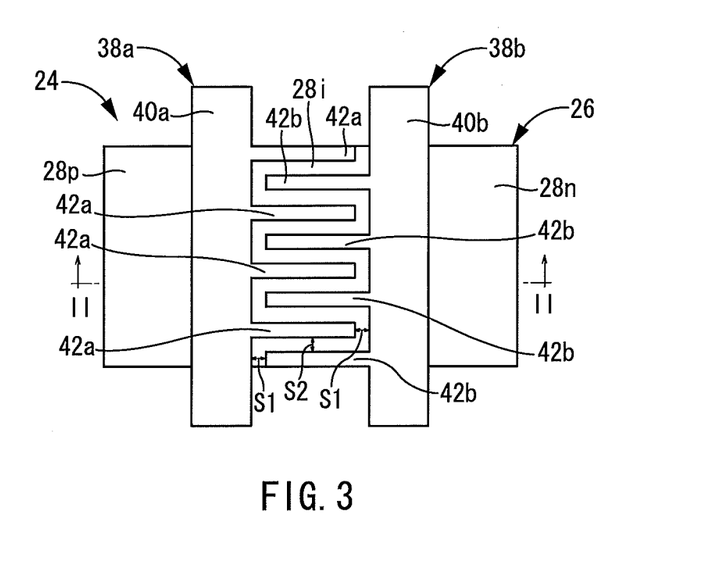
FIG. 3 is an enlarged plan view showing the optical sensor shown in FIG. 2.

The gate lines 38a and 38b include boundary definition lines 40a and 40b, as well as four extension lines 42a and 42b, respectively, as shown in FIG. 3. In the present embodiment, the boundary definition line 40a corresponds to the first boundary definition line, the boundary definition line 40b corresponds to the second boundary definition line, each extension line 42a corresponds to the first extension line, and each extension line 42b corresponds to the second extension line. It should be noted that in FIG. 2, only the boundary definition lines 40a and 40b provided in the gate lines 38a and 38b are shown. This is because a clearance S2 formed between the two extension lines 42a and 42b positioning adjacent in the direction perpendicular to the forward direction of the photodiode 26 (the vertical direction in FIG. 3) is filled with an interlayer insulating film 44.

Each of the boundary definition lines 40a and 40b extends in the direction (the vertical direction in FIG. 3) perpendicular to the forward direction of the photodiode 26, with an approximately constant line width. The boundary definition line 40a extends along the boundary between the intrinsic semiconductor region 28i and the p-type semiconductor region 28p. An edge 41a (see FIG. 2) of the boundary definition line 40a, on a side opposite to the gate line 38b side, when projected in the thickness direction of the glass substrate 18, falls on the boundary between the intrinsic semiconductor region 28i and the p-type semiconductor region 28p. The boundary definition line 40b extends along the boundary between the intrinsic semiconductor region 28i and the n-type semiconductor region 28n. An edge 41b (see FIG. 2) of the boundary definition line 40b, on a side opposite to the gate line 38a side, when projected in the thickness direction of the glass substrate 18, falls on the boundary between the intrinsic semiconductor region 28i and the n-type semiconductor region 28n. Each of the boundary definition lines 40a and 40b, when projected in the thickness direction of the glass substrate 18, crosses the semiconductor film 28.

The line width of each of the boundary definition lines 40a and 40b may be 3 μm or more. It should be noted that in the present embodiment, the line width of each of the boundary definition lines 40a and 40b is set to 3 μm.

The extension lines 42a and 42b extend, each with an approximately constant line width, from the boundary definition lines 40a and 40b on one side to the other boundary definition lines 40b and 40a on the other side, respectively. The line width of each of the extension lines 42a and 42b are set with the length of the intrinsic semiconductor region 28i in the direction perpendicular to the forward direction of the photodiode 26 and the like taken into consideration. It should be noted that in the present embodiment, the line width of each of the extension lines 42a and 42b is set to 1 μm, which is smaller than the line width of the boundary definition lines 40a and 40b.

Between extension ends of the extension lines 42a and 42b and edges of the boundary definition lines 40b and 40a on the gate lines 38a and 38b sides, respectively, predetermined clearances S1 are formed. In other words, the extension lines 42a and 42b on one hand, and the boundary definition lines 40b and 40a on the other hand, are distanced in the direction parallel with the forward direction of the photodiode 26, at a predetermined distance S1. Each clearance S1 may have a width of 3 to 5 μm. It should be noted that in the present embodiment, each clearance S1 has a width of 4 μm.

The four extension lines 42a, which extend from the boundary definition line 40a, and the four extension lines 42b, which extend from the boundary definition lines 40b, are positioned at constant intervals in the lengthwise direction of the boundary definition lines 40a and 40b, that is, the direction perpendicular to the forward direction of the photodiode 26.

One extension line 42a, among the four extension lines 42a extending from the boundary definition line 40a, is formed along one of two edges of the intrinsic semiconductor region 28i (along the upper end thereof as viewed in FIG. 3), extending in the direction parallel with the forward direction of the photodiode 26. One extension line 42b, among the four extension lines 42b extending from the boundary definition line 40b, is formed along the other one of the two edges of the intrinsic semiconductor region 28i (along the lower end thereof as viewed in FIG. 3), extending in the direction parallel with the forward direction of the photodiode 26.

The extension lines 42a extending from the boundary definition line 40a and the extension lines 42b extending from the boundary definition line 40b are arranged alternately in the direction perpendicular to the forward direction of the photodiode 26. Clearances S2 each of which is formed between two of the extension lines 42a and 42b that are adjacent in the direction perpendicular to the forward direction of the photodiode 26 have approximately the same size. In other words, two of the extension lines 42a and 42b that are adjacent in the direction perpendicular to the forward direction of the photodiode 26 are distanced in the direction perpendicular to the forward direction of the photodiode 26, at a predetermined distance S2. Each of the clearance S2 may have a width of 3 to 5 μm. It should be noted that in the present embodiment, the width of each clearance S2 is set to 4 μm.

Each of the gate lines 38a and 38b are connected to the gate driver 20. Thus, a voltage is applied to each of the gate lines 38a and 38b. It should be noted that in the present embodiment, a negative voltage is applied to the gate line 38a, and a positive voltage is applied to the gate line 38b.

With the application of voltages in this way, in the intrinsic semiconductor region 28i, holes increase in a region positioned below the gate line 38a (the boundary definition line 40a and the four extension lines 42a extending from the boundary definition line 40a), while free electrons increase in a region positioned below the gate line 38b (the boundary definition line 40b and the four extension lines 42b extending from the boundary definition line 40b). This causes the p-type semiconductor region 28p to substantially spread to the region positioned below the gate line 38a in the intrinsic semiconductor region 28i. This also causes the n-type semiconductor region 28n to substantially spread to the region positioned below the gate line 38b in the intrinsic semiconductor region 28i. As a result, the region where photoexcitation occurs in response to received light is formed so as to extend in such a manner as to snake toward the direction perpendicular to the forward direction of the photodiode 26.

The substantial length of the intrinsic semiconductor region 28i in the direction parallel with the forward direction of the photodiode 26 becomes substantially the same as the width of the clearance formed between the two gate lines 38a and 38b, in an upper part of the intrinsic semiconductor region 28i. In other words, the substantial length of the intrinsic semiconductor region 28i in the direction parallel with the forward direction of the photodiode 26 becomes substantially the same as the width of the clearances S1 formed between the extension lines 42a and 42b on one hand and the boundary definition lines 40b and 40a on the other hand, respectively, and the width of the clearances S2 each of which is formed between the two extension lines 42a and 42b adjacent in the direction perpendicular to the forward direction of the photodiode 26. The substantial length of the intrinsic semiconductor region 28i in the direction perpendicular to the forward direction of the photodiode 26 is increased sufficiently beyond its original length in the direction perpendicular to the forward direction of the photodiode 26, since the region where photoexcitation occurs in response to received light is formed so as to extend in such a manner as to snake toward the direction perpendicular to the forward direction of the photodiode 26.

The interlayer insulating film 44 is formed on the gate insulating film 34 so as to cover the gate lines 38a and 38b. As the interlayer insulating film 44, a film obtained by forming a silicon nitride film and a silicon oxide film in this order, for example, can be used. It should be noted that the interlayer insulating film 44 also covers a gate electrode provided in a thin film transistor that is not shown.

Further, in the interlayer insulating film 44 and the gate insulating film 34, contact holes 46 and 48 that pass through them in the thickness direction are formed. The contact hole 46 is formed at a position that, when projected in the thickness direction of the glass substrate 18, falls on the p-type semiconductor region 28p. The contact hole 48 is formed at a position that, when projected in the thickness direction of the glass substrate 18, falls on the n-type semiconductor region 28n. With the contact holes 46 and 48 thus formed, electrodes/lines 50 and 52 formed on the interlayer insulating film 44 are connected to the p-type semiconductor region 28p and the n-type semiconductor region 28n, respectively. As the electrodes/lines 50 and 52, those having a two-layer structure composed of a titanium nitride film and an aluminum film may be used, for example.

Further, a flattening film 54 is formed on the interlayer insulating film 44, so as to cover the electrodes/lines 50 and 52. As the flattening film 54, an organic insulating film made of, for example, a photosensitive acrylic resin, or apart from this, a silicon oxide film, can be used, for example. The flattening film 54 has a thickness of 1000 to 4000 nm.

Next, a method for manufacturing the active matrix substrate 12 provided with such an optical sensor 24 is explained below. It should be noted that the method for manufacturing the active matrix substrate 12 provided with the optical sensor 24 is not limited to the manufacturing method described below.

Figure 4A:
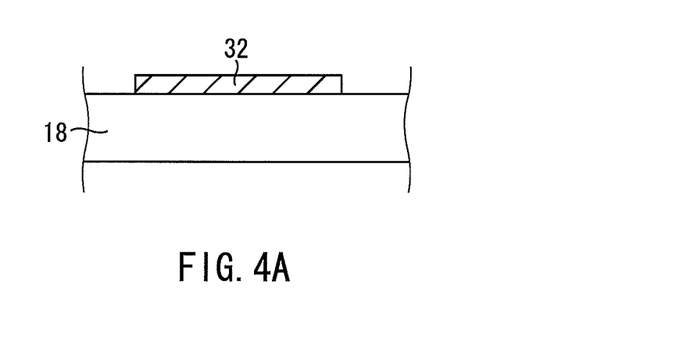
FIG. 4A is a cross-sectional view for explaining a step in a process of manufacturing an active matrix substrate provided in the liquid crystal panel shown in FIG. 1, which shows a state in which a light shielding film is formed on the substrate.

First, the light shielding film 32 is formed at a predetermined position on the glass substrate 18. More specifically, first, a metal film that is to be the light shielding film 32 later is formed over an entire upper surface of the glass substrate 18 by sputtering. Then, this metal film is patterned by photolithography. This causes the light shielding film 32 to be formed at the predetermined position on the glass substrate 18, as shown in FIG. 4A.

Next, the base layer 30 is formed on an upper side of the glass substrate 18 by CVD (chemical vapor deposition). This causes an entire surface on the upper side of the glass substrate 18 to be covered with the base layer 30.

Figure 4B:
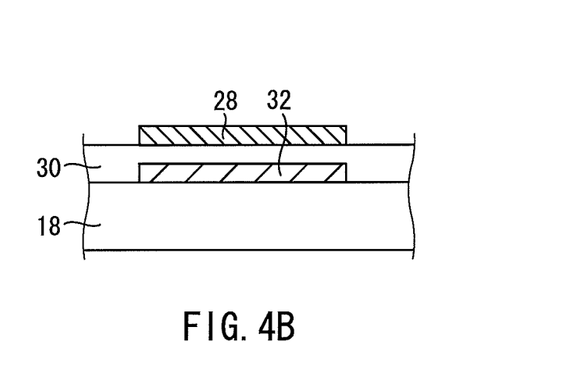
FIG. 4B is a cross-sectional view for explaining a step in the process of manufacturing the active matrix substrate provided in the liquid crystal panel shown in FIG. 1, which shows a state in which a semiconductor film is formed on a base layer.

Subsequently, the semiconductor film 28 is formed on the base layer 30. More specifically, first, an amorphous silicon film is formed over an entire upper surface of the base layer 30 by plasma CVD, sputtering, or the like. Then, the amorphous silicon film is irradiated with an excimer laser. This causes a polysilicon film to be formed so as to cover the entire upper surface of the base layer 30. Thereafter, the polysilicon film is patterned by photolithography. This causes the semiconductor film 28 to be formed at the predetermined position on the base layer 30, as shown in FIG. 4B. It should be noted that in the present embodiment, the semiconductor film 28 provided in the photodiode 26 is formed by utilizing the step of forming the semiconductor film provided in the thin film transistor.

Next, the gate insulating film 34 is formed above the glass substrate 18 by plasma CVD or the like. This causes the entire surface on the upper side of the glass substrate 18 to be covered with the gate insulating film 34. It should be noted that in the present embodiment, the gate insulating film 34 is formed by utilizing the step of forming the gate insulating film provided in the thin film transistor.

Figure 4C:
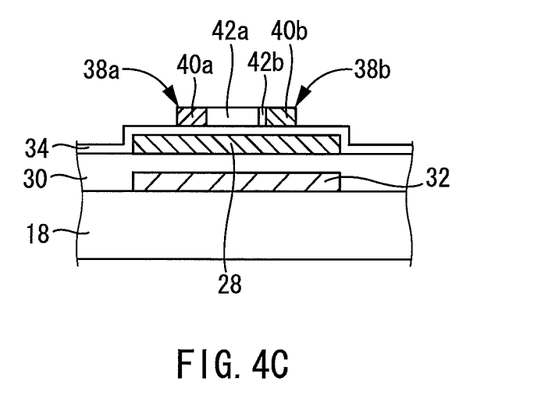
FIG. 4C is a cross-sectional view for explaining a step in the process of manufacturing the active matrix substrate provided in the liquid crystal panel shown in FIG. 1, which shows a state in which gate lines are formed on a gate insulating film.

Subsequently, the gate lines 38a and 38b are formed on the gate insulating film 34. More specifically, first, a conductive film which will become the gate lines 38a and 38b later is formed over an entire upper surface of the gate insulating film 34 by sputtering, vacuum vapor deposition, CVD, or the like. Thereafter, this conductive film is patterned by photolithography. This causes the gate lines 38a and 38b to be formed at predetermined positions on the gate insulating film 34, as shown in FIG. 4C. It should be noted that in the present embodiment, the gate lines 38a and 38b provided in the optical sensor 24 are formed by utilizing the step of forming the gate electrodes provided in the thin film transistor.

Figure 4D:
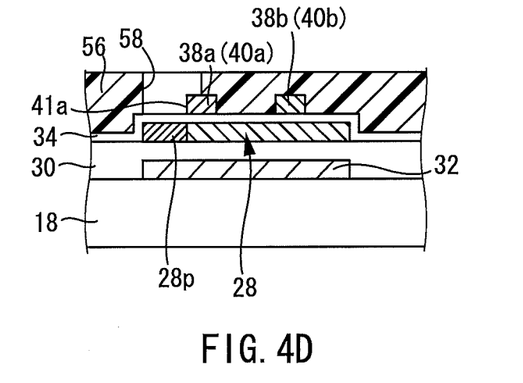
FIG. 4D is a cross-sectional view for explaining a step in the process of manufacturing the active matrix substrate provided in the liquid crystal panel shown in FIG. 1, which shows a state in which a p-type impurity is implanted.

Next, a p-type impurity such as boron is implanted in the semiconductor film 28. More specifically, first, as shown in FIG. 4D, a resist mask 56 made of a resist is formed over the gate insulating film 34 so as to cover a part of the semiconductor film 28. The resist mask 56 has an opening 58 that is formed so as to exposes a part that overlaps a region where the p-type semiconductor region 28p is to be formed. The opening 58 partially overlaps the boundary definition line 40a in the gate line 38a. Thus, the boundary between the p-type semiconductor region 28p and the intrinsic semiconductor region 28i is defined by an edge 41a of the boundary definition line 40a in the gate line 38a.

After the resist mask 56 is formed in this way, the p-type impurity such as boron is implanted by ion doping. Thus, the p-type impurity is implanted in the region not covered with the boundary definition line 40a of the gate line 38a and the resist mask 56, in the semiconductor film 28. As a result, the p-type semiconductor region 28p is formed in the semiconductor film 28. After the implantation of the p-type impurity into the semiconductor film 28 is completed, the resist mask 56 is removed.

Figure 4E:
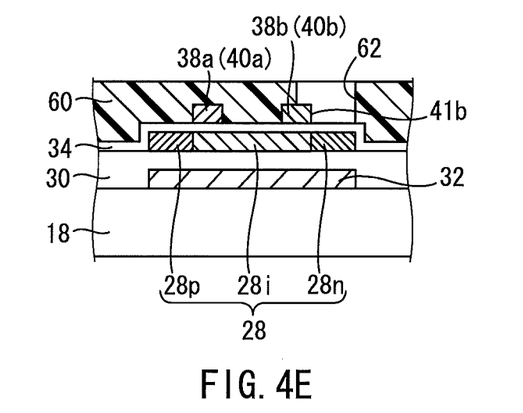
FIG. 4E is a cross-sectional view for explaining a step in the process of manufacturing the active matrix substrate provided in the liquid crystal panel shown in FIG. 1, which shows a state in which an n-type impurity is implanted.

Subsequently, an n-type impurity such as phosphorus is implanted into the semiconductor film 28. More specifically, first, as shown in FIG. 4E, a resist mask 60 made of a resist is formed over the gate insulating film 34 so as to cover a part of the semiconductor film 28. The resist mask 60 has an opening 62 that is formed so as to exposes a part that overlaps a region where the n-type semiconductor region 28n is to be formed. The opening 62 partially overlaps the boundary definition line 40b in the gate line 38b. Thus, the boundary between the n-type semiconductor region 28n and the intrinsic semiconductor region 28i is defined by an edge 41b of the boundary definition line 40b in the gate line 38a.

After the resist mask 60 is formed in this way, the n-type impurity such as phosphor is implanted by ion doping. Thus, the n-type impurity is implanted in the region not covered with the boundary definition line 40b of the gate line 38b and the resist mask 60, in the semiconductor film 28. As a result, the n-type semiconductor region 28n is formed in the semiconductor film 28. The region to which neither the p-type impurity nor the n-type impurity has been implanted, in the semiconductor film 28, becomes the intrinsic semiconductor region 28i formed with an intrinsic semiconductor. After the implantation of the n-type impurity into the semiconductor film 28 is completed, the resist mask 60 is removed. It should be noted that in the present embodiment, the n-type semiconductor region 28n is formed by utilizing the step of forming the source region and the drain region in the semiconductor film provided in the thin film transistor.

Next, the impurities implanted in the semiconductor film 28 is activated. More specifically, heat treatment by RTA (rapid thermal annealing) is carried out in an inert atmosphere. This causes doping damage such as crystal defects and the like that have occurred upon ion doping to be repaired, and impurities thus implanted to be activated, in the p-type semiconductor region 28p and the n-type semiconductor region 28n of the semiconductor film 28. It should be noted that in the present embodiment, the impurities implanted in the semiconductor film 28 are activated by utilizing the step of activating impurities implanted into the semiconductor film provided in the thin film transistor.

Subsequently, the interlayer insulating film 44 is formed on the upper side of the glass substrate 18 by plasma CVD or the like. This causes the entire surface of the upper side of the glass substrate 18 to be covered with the interlayer insulating film 44.

Figure 4F:
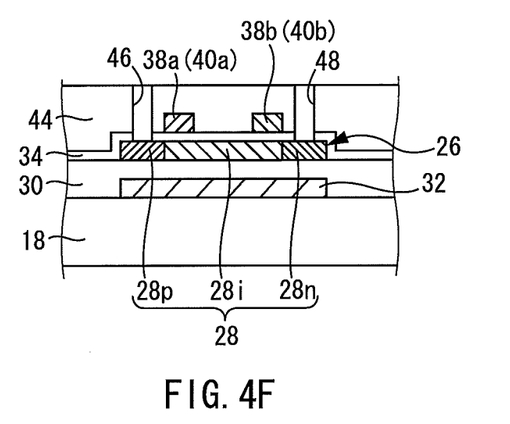
FIG. 4F is a cross-sectional view for explaining a step in the process of manufacturing the active matrix substrate provided in the liquid crystal panel shown in FIG. 1, which shows a state in which contact holes are formed in an interlayer insulating film and a gate insulating film.

In the interlayer insulating film 44 and the gate insulating film 34 thus formed, contact holes 46 and 48 are formed so as to pass through the interlayer insulating film 44 and the gate insulating film 34 in the thickness direction, as shown in FIG. 4F. The contact holes 46 and 48 are formed by photolithography.

Figure 4G:
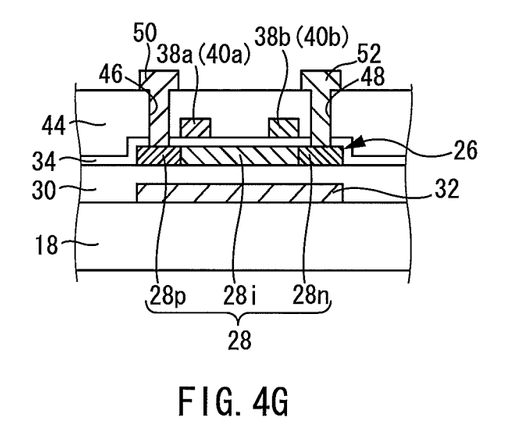
FIG. 4G is a cross-sectional view for explaining a step in the process of manufacturing the active matrix substrate provided in the liquid crystal panel shown in FIG. 1, which shows a state in which electrodes/lines are formed.

Next, the electrodes/lines 50 and 52 are formed on the interlayer insulating film 44. More specifically, first, a conductive film that will become the electrodes/lines 50 and 52 later is formed on the upper side of the glass substrate 18 by sputtering, CVD, or the like. This causes the entire surface on the upper side of the glass substrate 18 to be covered with the conductive film. Thereafter, the conductive film is patterned by photolithography. Thus, the electrodes/lines 50 and 52 are formed on the interlayer insulating film 44, as shown in FIG. 4G.

Subsequently, the flattening film 54 is formed on the upper side of the glass substrate 18. In the case where the flattening film 54 is an organic insulating film made of a photosensitive acrylic resin or the like, the flattening film 54 is formed with use of a spin coater. In the case where the flattening film 54 is an inorganic insulating film such as a silicon oxide film or the like, the flattening film 54 is formed by plasma CVD or the like. This causes the entire surface on the upper side of the glass substrate 18 to be covered with the flattening film 54. As a result, the active matrix substrate 12 as intended is obtained.

In such a liquid crystal panel 10, the substantial length of the intrinsic semiconductor region 28i in the direction perpendicular to the forward direction of the photodiode 26 can be gained. Therefore, even if the substantial length of the intrinsic semiconductor region 28i in the direction parallel with the forward direction of the photodiode 26 is decreased, it is possible to ensure a light receiving area of the photodiode 26. As a result, the light detection sensitivity of the photodiode 26 can be improved.

In the p-type semiconductor region 28p, which is substantially expanded owing to the application of a negative voltage to the gate line 38a, the thin-line-form extension portion that extends toward the n-type semiconductor region 28n side is a region positioned below the extension line 42a; and in the n-type semiconductor region 28n, which is substantially expanded owing to the application of a positive voltage to the gate line 38b, the thin-line-form extension portion that extends toward the p-type semiconductor region 28p side is a portion positioned below the extension line 42b. This makes it possible to ensure the light receiving area with a sufficiently decreased width of the extension portions, as compared with, for example, the case where the p-type semiconductor region having the thin-line-form extension portion extending toward the n-type semiconductor region side and the n-type semiconductor region having the thin-line-form extension portion extending toward the p-type semiconductor region side are formed in the semiconductor film by using a resist mask made of a resist.

In the case where the p-type semiconductor region having the thin-line-form extension portion extending toward the n-type semiconductor region side, and the n-type semiconductor region having the thin-line-form extension portion extending toward the p-type semiconductor region side are formed in the semiconductor film by using a resist mask made of a resist, it is necessary to carry out photolithography for forming the thin-line-form extension portions, that is, to form a resist mask, twice. As a result, the sizes of openings for forming the p-type semiconductor region and the n-type semiconductor region, formed in the resist mask, tend to vary, and the resist mask tends to be formed at a deviated position, which create adverse effects. Therefore, it is difficult to, ensure the light receiving area while sufficiently decreasing the width of the extension portions.

To explain in more detail, in the case where the p-type semiconductor region having the thin-line-form extension portion extending toward the n-type semiconductor region side, and the n-type semiconductor region having the thin-line-form extension portion extending toward the p-type semiconductor region side are formed in the semiconductor film by using a resist mask made of a resist, there is a problem that the substantial length of the intrinsic semiconductor region in the direction parallel with the forward direction of the photodiode varies due to the following causes: (1) the precision of the line width of the resist mask used for forming the p-type semiconductor region; (2) the precision of the line width of the resist mask used for forming the n-type semiconductor region; and (3) position deviation of the n-type semiconductor region with respect to the p-type semiconductor region. Besides, there is a problem that since the thin-line-form extension portions provided in the p-type semiconductor region and the n-type semiconductor region are formed by ion doping in a state in which a resist mask is formed, they cannot be made thinner than the line width of the resist mask.

However, in the present embodiment, the resist mask is formed only once in the formation of the gate lines 38a and 38b. Therefore, there are less adverse effects that would be provided when the sizes of the openings formed in the resist mask for forming the p-type and n-type semiconductor regions vary, when the resist mask is formed at a deviated position, or the like. Consequently, it is possible to ensure a sufficient light receiving area, with the line width of the extension portions being set sufficiently small.

To explain in more detail, in the present embodiment, only the precision of the line width of the resist mask used for forming the gate lines 38a and 38b, and the variation of the line width due to etching upon the formation of the gate lines 38a and 38b exert influences. Therefore, the variation of the substantial length of the intrinsic semiconductor region 28i in the direction parallel with the forward direction of the photodiode 26 can be suppressed. Further, though the line width of the resist mask cannot be reduced to smaller than the limit dimension of photolithography, the extension lines 42a and 42b can be thinned further by increasing the time of etching carried out when the extension lines 42a and 42b are formed. For example, even if the minimum dimension of the line width of the resist mask is 1.5 μm, the line width of the extension lines 42a and 42b can be decreased to 1 μm by increasing the time of etching.

As the extension lines 42a and 42b extending from the boundary definition lines 40a and 40b are arranged alternately in the direction perpendicular to the forward direction of the photodiode 26, the region where photoexcitation occurs in response to received light is formed extending in such a manner as to snake. This makes it easier to ensure a substantial length of the intrinsic semiconductor region 28i in the direction perpendicular to the forward direction of the photodiode 26.

All of the extension lines 42a and 42b extending from the boundary definition lines 40a and 40b have a width smaller than the width of the clearance S2 formed between two of the extension lines 42a and 42b that are adjacent in the direction perpendicular to the forward direction of the photodiode 26. This makes it easier to increase the number of times of bending of the region where photoexcitation occurs in response to received light, which extends in such a manner as to snake. As a result, this makes it easier to ensure the substantial length of the intrinsic semiconductor region 28i in the direction perpendicular to the forward direction of the photodiode 26.

This allows the substantial length of the intrinsic semiconductor region 28i in the direction parallel with the forward direction of the photodiode 26 to be reduced. This makes it possible to improve the response speed of the photodiode 26.

As the substantial length of the intrinsic semiconductor region 28i in the direction parallel with the forward direction of the photodiode 26 is set to 3 μm or more (4 μm in the present embodiment), it is possible to avoid a problem that the region where photoexcitation occurs decreases. As a result, this configuration makes it possible to prevent the light conversion efficiency of the photodiode 26 from decreasing.

As the substantial length of the intrinsic semiconductor region 28i in the direction parallel with the forward direction of the photodiode 26 is set to 5 μm or less (4 μm in the present embodiment), this makes it possible to avoid a problem that a region where photoexcitation does not occur is present in the intrinsic semiconductor region 28i and the region becomes a resistive region, thereby causing a decrease in an output.

One of the four extension lines 42a extending from the boundary definition line 40a of the gate line 38a is formed along one of the two edges of the intrinsic semiconductor region 28i, the two edges extending in the direction parallel with the forward direction of the photodiode 26. Further, one of the four extension lines 42b extending from the boundary definition line 40b of the gate line 38b is formed along the other of the two edges of the intrinsic semiconductor region 28i, the two edges extending in the direction parallel with the forward direction of the photodiode 26. This configuration makes it possible to efficiently form the region where photoexcitation occurs in response to received light, in the intrinsic semiconductor region 28i. As a result, this makes it easier to ensure the light receiving area.

[Embodiment 2]

Figure 5:
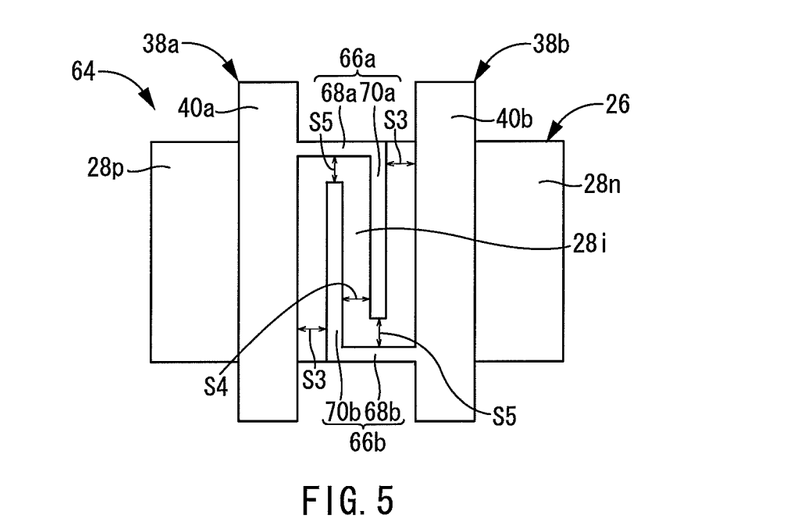
FIG. 5 is a plan view showing a schematic configuration of an optical sensor as Embodiment 2 of the present invention.

Next, Embodiment 2 of the present invention relating to an optical sensor is explained based on FIG. 5. It should be noted that members and portions in Embodiment 2 described below, and in Embodiment 3 to be described later, having the same configurations as those in Embodiment 1, are denoted by the same reference numerals as those in Embodiment 1 in the drawings, and detailed explanations of the same are omitted.

An optical sensor 64 of the present embodiment is different from the optical sensor (24) of Embodiment 1 regarding extension lines 66a and 66b in the gate lines 38a and 38b. The extension lines 66a and 66b of the present embodiment include parallel extension portions 68a and 68b, and perpendicular extension portions 70a and 70b, respectively.

The parallel extension portions 68a and 68b extend in the direction parallel with the forward direction of the photodiode 26, with approximately constant line widths, from the boundary definition lines 40a and 40b, respectively. The perpendicular extension portions 70a and 70b extend in the direction perpendicular to the forward direction of the photodiode 26, with approximately constant line widths, from extension ends of the parallel extension portions 68a and 68b, respectively.

Clearances S3 formed between the perpendicular extension portions 70a and 70b and the boundary definition lines 40b and 40a, respectively, a clearance S4 formed between the perpendicular extension portion 70a and the perpendicular extension portion 70b, and clearances S5 formed between the perpendicular extension portions 70a and 70b and the parallel extension portions 68b and 68a, respectively, may have a width of 3 to 5 μm each.

[Embodiment 3]

Figure 6:
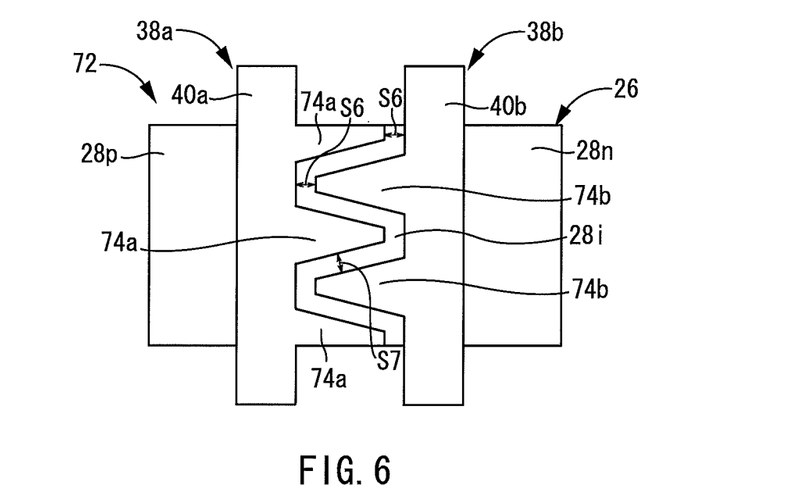
FIG. 6 is a plan view showing a schematic configuration of an optical sensor as Embodiment 3 of the present invention.

Next, Embodiment 3 of the present invention relating to an optical sensor is explained based on FIG. 6. An optical sensor 72 of the present embodiment is different from the optical sensor (24) of Embodiment 1 regarding extension lines 74a and 74b of the gate lines 38a and 38b.

The extension lines 74a and 74b of the present embodiment are shaped so that a line width of each decreases with increasing proximity to the end in the extending direction. Clearances S6 formed between extension ends of the extending lines 74a and 74b and the boundary definition lines 40b and 40a, respectively, and a clearances S7 formed between the extension line 74a and the extension line 74b may have a width of 3 to 5 μm each.

The embodiments of the present invention, which have been described in detail so far, are merely illustrative examples, and the present invention is not limited by the above-described embodiments at all.

For example, in Embodiments 1 to 3, the application of voltages to the gate lines 38a and 38b may be carried out by the data drivers 22. Alternatively, a circuit exclusively for applying voltages to the gate lines 38a and 38b may be provided separately.

The invention claimed is:

1. An optical sensor comprising:
a photodiode provided with a semiconductor film having a p-type semiconductor region, an intrinsic semiconductor region, and an n-type semiconductor region;
a first gate line formed above the intrinsic semiconductor region, a negative voltage being applied to the first gate line; and
a second gate line formed above the intrinsic semiconductor region, a positive voltage being applied to the second gate line,
wherein the first gate line includes:
a first boundary definition line that extends along a boundary between the intrinsic semiconductor region and the p-type semiconductor region and crosses the intrinsic semiconductor region; and
a first extension line that extends from the first boundary definition line toward the second gate line,
the second gate line includes:
a second boundary definition line that extends along a boundary between the intrinsic semiconductor region and the n-type semiconductor region and crosses the intrinsic semiconductor region; and
a second extension line that extends from the second boundary definition line toward the first gate line, and
a predetermined clearance is formed between the first gate line and the second gate line, above the intrinsic semiconductor region.

2. The optical sensor according to claim 1, wherein at least either the first extension line or the second extension line is plural in the number, and the first extension lines and the second extension lines are arranged alternately in a direction perpendicular to a forward direction of the photodiode.

3. The optical sensor according to claim 2, wherein the first extension line has a width smaller than a width of the predetermined clearance formed between the first extension line and the second extension line.

4. The optical sensor according to claim 2, wherein the second extension line has a width smaller than a width of the predetermined clearance formed between the first extension line and the second extension line.

5. The optical sensor according to claim 1, wherein the predetermined clearance formed between the first gate line and the second gate line above the intrinsic semiconductor region has a width of 3 to 5 μm.

6. The optical sensor according to claim 1, wherein at least one of the first extension line and the second extension line is formed along an edge of the intrinsic semiconductor region extending in a direction parallel with a forward direction of the photodiode.

7. A liquid crystal panel comprising:
   the optical sensor according to claim 1;
   a substrate on which the optical sensor is formed;
   a counter substrate arranged vis-à-vis a surface of the substrate on which the optical sensor is formed; and
   a liquid crystal layer sealed between the substrate and the counter substrate.

* * * * *